United States Patent [19]
Berner

[11] 3,771,025
[45] Nov. 6, 1973

[54] SEMICONDUCTOR DEVICE INCLUDING LOW IMPEDANCE CONNECTIONS

[75] Inventor: Warren E. Berner, Camillus, N.Y.

[73] Assignee: General Electric Company

[22] Filed: Oct. 2, 1969

[21] Appl. No.: 863,210

[52] U.S. Cl. ..... 317/234 R, 317/234 E, 317/234 G, 317/234 N, 317/234 W, 29/576
[51] Int. Cl. ............................ H01l 3/00, H01l 5/00
[58] Field of Search ................ 317/234, 5, 11, 235, 317/48.1, 5.4; 29/572–576

[56] References Cited

UNITED STATES PATENTS

| | | | |
|---|---|---|---|
| 3,503,125 | 3/1970 | Haberecht | 29/576 |
| 3,416,046 | 12/1968 | Dickson, Jr. et al | 317/234 |
| 3,192,083 | 6/1965 | Sirtl | 148/175 |
| 3,422,527 | 1/1969 | Gault | 29/572 |
| 3,383,760 | 5/1968 | Shwartzman | 29/577 |

*Primary Examiner*—John W. Huckert
*Assistant Examiner*—Andrew J. James
*Attorney*—Robert J. Mooney, Nathan J. Cornfeld, Carl O. Thomas, Frank L. Neuhauser, Oscar B. Waddell and Joseph B. Forman

[57] ABSTRACT

A plurality of semiconductor wafers each containing a junction are plated with aluminum on an N conductivity type surface and stacked between P conductivity type attachment wafers. The stack is heated to bond the wafers, gold is plated onto the endmost wafers, and excess aluminum at the periphery of the stack is removed. The wafer stack is subdivided first into slabs and then the slabs repositioned to close the kerf formed by sawing. The repositioned slabs are then subdivided into unitary dice stacks. The unitary dice stacks are then attached to gold coated leads and freed of surface contaminants by flow etching. The cleaned unitary dice stacks are separately protectively encapsulated to form completed rectifiers by first depositing a passivant over the semiconductive surfaces and then molding a plastic housing around the elements.

5 Claims, 7 Drawing Figures

INVENTOR:
WARREN E. BERNER,
BY Carl O. Thomas
HIS ATTORNEY.

INVENTOR:
WARREN E. BERNER,
BY Carl O. Thomas
HIS ATTORNEY.

INVENTOR:
WARREN E. BERNER,

BY Carl O. Thomas
HIS ATTORNEY.

SEMICONDUCTOR DEVICE INCLUDING LOW IMPEDANCE CONNECTIONS

I have observed that a number of metals employed in bonding to semiconductive crystals can be more readily adhered to a P type conductivity surface or an N type conductivity surface than to a similar semiconductive surface of opposite conductivity characteristics. For example, gold and aluminum form tenacious low impedance bonds to P type silicon much more readily than to N type silicon. At the same time electroless nickel is more readily adhered to N type silicon than to P type silicon. Usually, by taking care to control a number of process variables, it is possible to form a tenacious low impedance bond of such metals to both P and N type conductivity surfaces. Frequently, however, freedom to impose conditions optimum for bonding to a less favored conductivity type surface is restricted by other considerations. For example, when a semiconductive element or assembly has reached a state of processing requiring lead attachment, one or more solder bonds and/or diffused junctions may be present that preclude utilizing otherwise acceptable approaches for achieving less readily realizable bonds. In this regard it is to be noted that in the majority of semiconductor devices lead attachments are required to both N and P type conductivity surfaces. Thus, it is not surprising that poor lead attachment remains a persistent source of yield loss in the manufacture of semiconductor devices.

It is an object of my invention to provide a novel semiconductor device in which the disadvantage of lead attachment to a less favored conductivity type surface is obviated.

It is another object of my invention to provide a semiconductor device in which lead attachment to a semiconductive sub-assembly is identically accomplished for each of two terminal leads.

These and other objects of my invention are accomplished in one aspect by providing in a semiconductor device the improvement comprising junction containing semiconductive means presenting first and second spaced bonding surfaces of first and second conductivity types, respectively. Electrical conductors are provided for low impedance electrical interconnection to the spaced bonding surfaces. A semiconductive element of the first conductivity type is interposed between the second bonding surface and one of the electrical conductors. First means are provided for bonding the semiconductive element to the second bonding surface, and second bonding means are provided for forming a low impedance electrical connection between one of the conductors and the first bonding surface and a remaining of the conductors and the semiconductive element. The second bonding means is preferentially adherent to semiconductive surfaces of the first conductivity type.

My invention may be better appreciated by reference to the following detailed description considered in conjunction with the drawings, in which FIG. 1 is a flow diagram of steps for practicing a preferred process according to my invention;

In a preferred application of my invention I form a plurality of rectifiers capable of blocking a relatively high voltage by utilizing a plurality of $PNN^+$ silicon wafers as starting elements. For each stack of wafers to be created I also employ two attachment wafers of P type conductivity, preferably of low resistivity (more than $10^{20}$ impurity atoms/$cm^3$), so that conduction losses therethrough are maintained at a low level. The $N^+$ surface of each of the junction containing wafers and one surface of one P type attachment wafer to be included in a stack is intimately associated with a layer of aluminum. This may be accomplished in any of a variety of conventional ways, but is preferably accomplished by vapor plating, sputtering, electroplating, or other accurately controllable deposition techniques, since for most applications a thin layer of aluminum is required, typically less than a mil in thickness. The purpose of plating aluminum onto the $N^+$ wafer surfaces is to insure an intimate association, since aluminum is known to bond to P type silicon wafer surfaces more readily than to $N^+$ wafer surfaces. Thus, I achieve metallization of the wafer surfaces less favored for bonding, as is schematically indicated by Step A in FIG. 1.

While I regard aluminum as a preferred bonding metal for reasons more fully explained below, I recognize that common bonding metals (including alloys) may be substituted for aluminum and that most bonding metals and bonding systems made up for sequential metal layers exhibit a greater readiness to bond to either P or N conductivity type wafer surfaces than to surfaces of opposite conductivity characteristic. In using other bonding metals instead of aluminum I still prefer to plate or otherwise deposit the metals on the surface of the wafer less favored for bonding. For example, in substituting for aluminum gold, which, like aluminum, more readily bonds to P conductivity type surfaces than to N conductivity type surfaces, I consider it advantageous to initially plate the gold onto the $N^+$ wafer surfaces, but where electroless nickel is plated onto the wafer surfaces, however, I prefer to deposit the nickel onto the P type surfaces of the wafers, since it is recognized that electroless nickel bonds more readily to N conductivity type surfaces.

Figure 1:
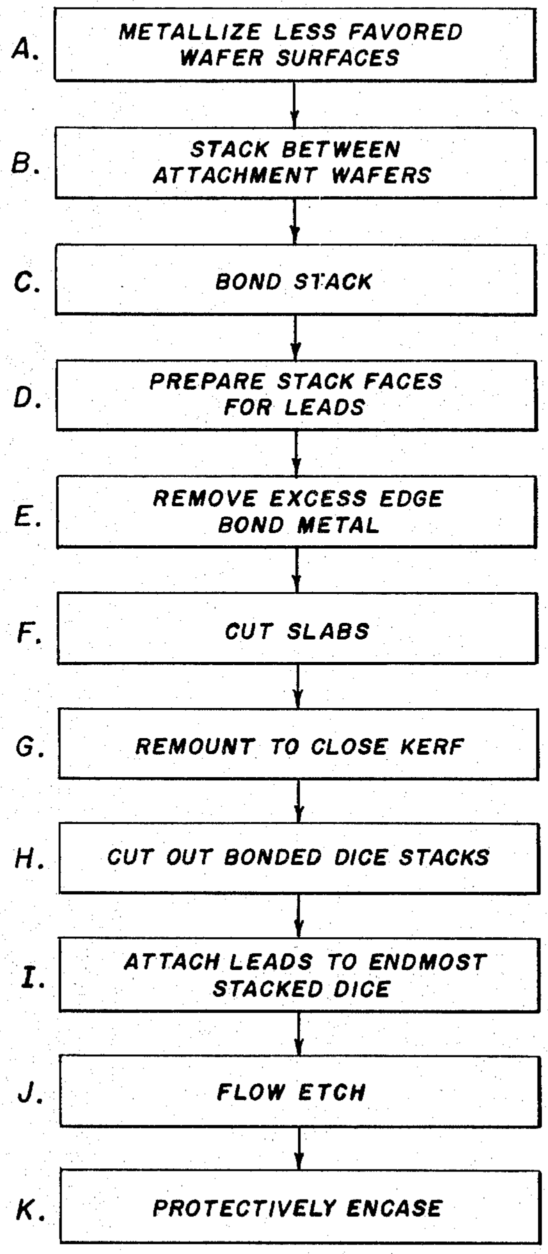
Figure 2:
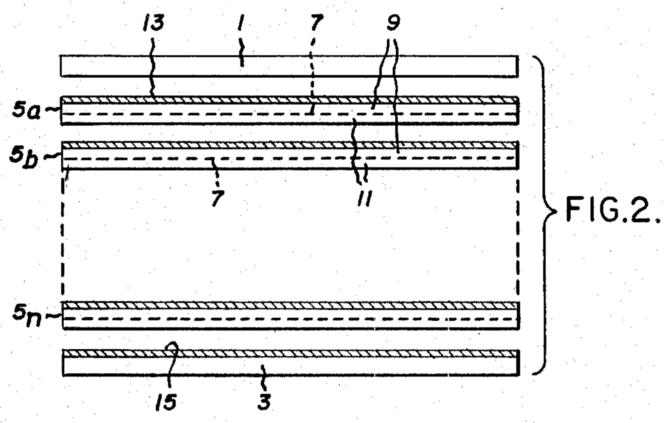
FIG. 2 is an exploded schematic view showing the stacking sequence of wafers for bonding.

To bond the wafers in the desired relationship they are stacked between the attachment wafers as indicated by Step B, FIG. 1, in a manner best appreciated by reference to FIG. 2, which shows the stacked wafers in exploded relationship. The attachment wafers 1 and 3 are preferably of P conductivity type and junctionless. The wafers 5*a*, 5*b*,......5*n* located between the attachment wafers are identical and may be varied in number, depending upon the maximum blocking voltage to be encountered by the completed rectifiers. Each of the wafers 5 contain at least one rectifying junction 7, schematically shown. The junctions 7 effectively divide the wafers 5 into an N conductivity type zone or region 9 lying thereabove and a P conductivity type zone or region 11 lying therebeneath. An aluminum bonding layer 13 is positioned in intimate association with the upper major surface of each wafer formed by the N conductivity type zone thereof. It is to be noted that an aluminum layer 15 is also associated with the upper surface of the lower attachment wafer to complete the stacking sequence of having one bonding metal layer between each adjacent pair of wafers.

Bonding of the wafers into a unitary stack according to process Step C is accomplished by bringing the wafers to a temperature above the melting point of the bonding metal. For aluminum bonding the stack is normally brought to a temperature above the 660° C melting temperature of this metal. Where silicon wafers are being bonded the stack should be heated to at least 580° C, the aluminum-silicon eutectic melting point. Preferably the stack is subjected to compression while the bonding metal is deformable so that the wafers are urged into close association and voids between adjacent wafers are eliminated. Stack compression may be conveniently achieved simply by maintaining a weight positioned on the upper attachment wafer of the stack during heating.

The exterior faces of the unitary stack are prepared for lead attachment according to Step D by roughening the surfaces, as by sandblasting, to insure a roughened surface to which adhesion may be readily obtained. Thereafter the roughened attachment wafer faces are etched to remove residual surface impurities and defects. Lead attachment metallization may then be applied.

In the course of bonding to form a unitary stack a portion of the bonding metal may flow from between the wafers, particularly when compression is applied while the bonding metal is in fluid condition. This leaves an excess of bonding metal overlying the edge of the stack. While this metal may be left in place during subsequent subdivision, I have observed that the stack is more easily sawn into elements when the excess bonding metal is removed, as indicated by Step E. The reason for this is that the bonding metal is more pliant than the wafer metal, tending to be tracked by a saw blade into the kerf rather than to immediately wash free of the kerf in the manner of the more brittle silicon. Hence, excess bonding metal at the edge of the stack slows subsequent sawing of the unitary wafer stack. I have accordingly found it advantageous to saw away the periphery of the stack preliminary to sawing the stack into separate elements to leave a stack periphery free of excess metal. For circular wafers a circular cut with a wafer sizing cutter just inside the periphery of the stack has worked well inasmuch as such a circular cut does not require transverse of any of the excess metal accumulation associated with the stack edge and also allows maximum silicon retention. It is also anticipated that excess edge metallization may be removed by other well known machining techniques, such as planing or turning, or by chemical techniques, such as aluminum removal through acid attack.

Figure 3:
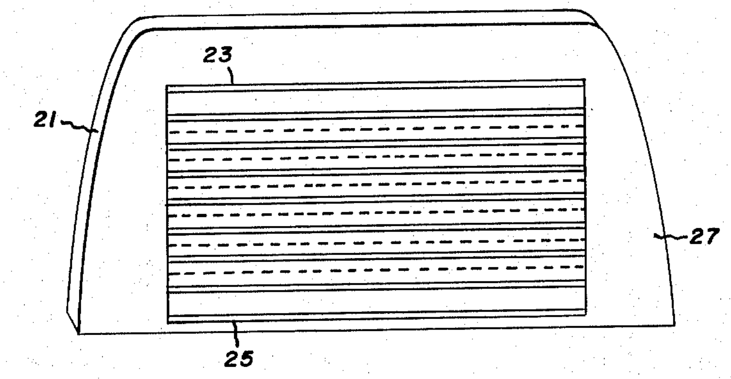
FIG. 3 is an isometric view of a first pass slab cut from a wafer stack.

The unitary wafer stack may be subdivided in order to form a plurality of separately useable rectifier elements. The degree of subdivision varies inversely with the current carrying capacity desired for the rectifiers, as is well understood in the art. Assuming a large area wafer stack as compared to the cross-sectional area required by each rectifier element to meet its desired current rating, the wafer can be subdivided into many separately useable rectifier elements. According to a preferred technique, the united wafer stack is encapsulated in a removable plastic material, such as wax or a readily strippable resin, and mounted on a handling pallet. The wafer stack is preferably cut into a plurality of slabs, as set forth by Step F, using a plurality of ganged, substantially parallel reciprocating saws. Other conventional slab sawing techniques are, of course, useful also. Noting FIG. 3, a slab 21 is shown. It is to be noted that the slab includes a portion of each of the elements of the original wafer stack shown in FIG. 2, but in unitary bonded relation. Additionally, lead metallization strips 23 and 25 are adhered to the outer surfaces of the P type attachment wafer portions. The entire stack is encapsulated by removable plastic material 27, which is used to attach the wafer initially to the pallet and, more importantly, encapsulates the wafer stack during slabbing to prevent chipping of the semiconductive material in sawing.

In order to further subdivide the slabs into unitary dice stacks for utilization in rectifiers, it would appear only necessary to rotate the slab a quarter turn with respect to the saw blades and to repeat the sawing operation. This has been observed, however, to result in substantial damage to the dice stacks. Just as sawing the wafer stacks initially into slabs without providing a protective covering in the form of plastic material to the exposed surfaces of the wafer stack results in damage to the semiconductive material, so also the exposed surfaces of the semiconductive material of the slabs is damaged in sawing, unless the kerf formed by slabbing is closed. To this end I have observed that a convenient technique for dicing slabs is to place a thin coating of plastic material on one or both of the surfaces of a slab formed initially by sawing and to stack a plurality of slabs so that they are held adhesively joined into a compact body by the additionally supplied plastic material. Preferably the plastic material is united into a coherent body after restacking of the slabs in this manner and efficiently covers all surfaces of the semiconductive material. Note Step G, FIG. 1. The slabs may then be subdivided into unitary dice stacks by cutting through the slabs in a direction approximately normal to the saw cut major surfaces of the slabs according to Step H, FIG. 1.

Figure 4:
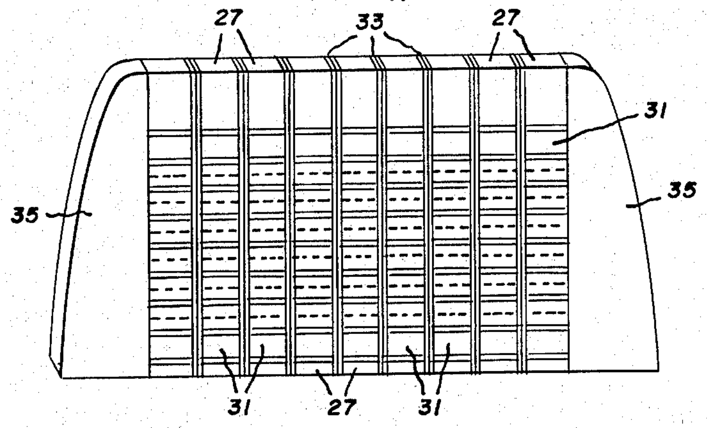
FIG. 4 is an isometric view of a second pass slab containing bonded dice stacks.

FIG. 4 illustrates a plurality of unitary dice stacks 31 as they appear immediately after formation by sawing from a plurality of associated slabs as above described. It is to be noted that each of the unitary dice stacks includes a portion of each element of the slab and of the wafer stack from which it was formed, the difference between a dice stack, slab stack, and wafer stack being principally related to cross-sectional area and secondarily, in the form shown, to geometry.

It is to be noted that the plastic material 27 lying immediately above and below each dice stack is derived from the slab from which the dice stack originated. The plastic material layers 33 between adjacent dice stacks correspond to the adhesive plastic material layers associated with the major surfaces of the slabs to achieve bonding. The bodies 35 of plastic material shown adjacent the endmost of the dice stacks is provided to protect the exposed surfaces of the endmost slabs after repositioning. While the plastic material is shown divided for ease of identification, it is appreciated that in actual practice the plastic material is preferably united so that it forms a single body.

It is to be noted that the formation of the unitary dice stacks is accomplished without any necessity of separately handling the many small semiconductive pellets that make up the dice stacks. It can readily be appreciated that the time and expense required for separately stacking and bonding semiconductive dice would greatly exceed that required to stack, bond, and subdivide wafers. The unitary dice stacks formed by sawing may be treated in bulk to remove the plastic material. For example, a variety of conventional techniques are known for stripping wax used to mount semiconductive elements. After stripping away the plastic material the unitary dice stacks may be subjected to a preliminary cleaning treatment to remove surface damage and contaminants introduced by sawing.

In order to utilize the unitary dice stacks for rectification it is necessary that an electrical conductor be attached to each end thereof. It is to be noted that both of the endmost semiconductive surfaces of each dice stack are of like conductivity type. The choice of conductivity type for the endmost dice (and the attachment wafers from which they are formed) is dictated by the choice of bonding material to be used in attaching electrical conductors. That is, the endmost dice and the attachment wafers are chosen of a conductivity type that is most readily adherent to the lead attachment bonding metal. In the preferred embodiment of my invention in which aluminum is utilized internally as an initial bonding material, I have found it advantageous to utilize gold and P doped gold alloys to achieve lead attachment to endmost P conductivity type dice. The advantage of using gold in this combination is that it has a melting point well below the melting point of aluminum and hence can form a gold-silicon eutectic without disturbing the metallic bond or junction relationships present internally of the stack. The use of P conductivity type endmost dice is preferred for use, since gold readily adheres to semiconductive surfaces of this conductivity type. To further enhance the gold bond, gold contact metallization may be vapor plated or otherwise intimately associated with the end wafer surfaces prior to subdivision into slabs and dice stacks as part of the stack preparation for lead attachment as noted above in connection with process Step D. The ability to readily obtain tenacious lead bonds to the end of the dice stack is significantly improved by having both of the endmost semiconductive surfaces of the dice stack of like conductivity type. Thus, the disadvantage of attempting to form a tenacious, low impedance bond between a metal and a semiconductive surface of less readily bonded conductivity type is avoided. Further, lead attachments can be made to both ends of a stack using identical bonding materials and procedures, avoiding extra steps and delay in manufacture.

While I prefer to form high voltage rectifier stacks using aluminum to achieve internal bonding of semiconductive elements and gold for lead attachment bonding for the reasons above noted, it is contemplated that a wide range of conventional semiconductor bonding metals and metal systems may be substituted for gold and/or aluminum. It is recognized that where aluminum or, preferably, a higher melting point metal is used for internal bonding, aluminum may be substituted for gold as a lead bonding metal. It is recognized that aluminum, like gold readily alloys with P conductivity type silicon to form tenacious low impedance bonds, although it bonds to N type silicon less readily. In choosing a lead attachment metal it is recognized that it must be applicable to the stack at a temperature not in excess of the melting point of the internal bonding metal and, preferably, below this temperature.

The electrical conductors to be bonded to the endmost surfaces of the unitary dice stack may be chosen from a variety of known conventional conductors in a manner well understood in the art. As a specific example, in bonding to P conductivity type silicon using gold as a bonding metal, I have found it particularly advantageous to utilize as an electrical conductor copper wire bearing a nickel coating and having a gold outer coating. The gold outer coating allows a very ready interconnection with the gold bonding metal while the nickel prevents an undesirable penetration of the gold into the copper and vice versa. By choosing the lead of a metal other than gold its cost is reduced and the disadvantage of embrittlement due to gold-silicon alloying is avoided.

Figure 5:
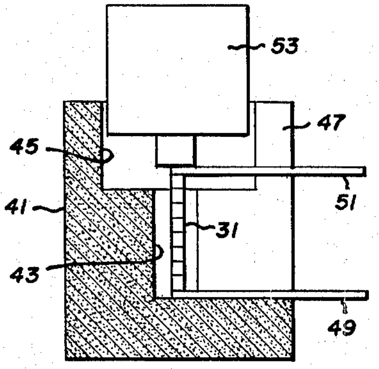
FIG. 5 is an elevation, partly in section, of a bonded dice stack positioned in a fixture for lead attachment.

A particularly advantageous arrangement for attaching leads to a unitary dice stack pursuant to process Step I is shown in FIG. 5. A fixture 41 formed of carbon or any other refractory, impurity free material is provided with a stack receiving bore 43 and a larger diameter weight receiving bore 45. A slot 47 opens laterally from the bores. A unitary dice stack 31 constructed as previously described is positioned in the stack bore so that its lower end rests on an electrical conductor 49. The bonding metal for lead attachment may be associated with the conductor 49 and the lower end of the dice stack as coatings on one or both. Additionally, if desired, a preform of bonding metal may be interposed between the electrical conductor and the lower end of the stack. In a similar manner an electrical conductor 51 is mounted adjacent the upper end of the dice stack. A weight 53 is positioned in the weight bore to rest on the internal extremity of the conductor 51 and to compressively urge the conductors into engagement with the ends of the dice stack. The fixture, weight, conductors, and stack in the assembled relationship shown may then be brought to a temperature sufficient to adhere the bonding metal to the conductors and stack. Typically this is the melting point of the bonding metal or the temperature at which it forms a eutectic with silicon.

Once the electrical conductors are attached, there is no longer any necessity of handling the unitary dice stack directly. Accordingly, the unitary dice stack can now be given a thorough cleaning to remove saw damaged surface portions and surface contaminants. A preferred approach is indicated by process Step J, FIG. 1. Holding the unitary dice stack by one of the attached leads, a conventional etchant may be flowed over the exposed semiconductor surfaces. The advantage of this approach over merely immersing the unitary dice stack in etchant, for example, is that a continuous supply of contaminant free etchant is being supplied to the semiconductive surfaces while etchant is being continuously swept away from the semiconductive surfaces with contaminants entrained. Accordingly, flow etching as contrasted with batch etching by immersion avoids any possibility of contaminants building up in the etchant to a point where back plating can occur. Back plating may be characterized as the redeposition of metal or contaminants which have entered the etchant at some other location on the surface being acted upon. By avoiding back plating I am able to significantly increase blocking voltage and operational life of the rectifier in which the stack is incorporated.

Figure 6:
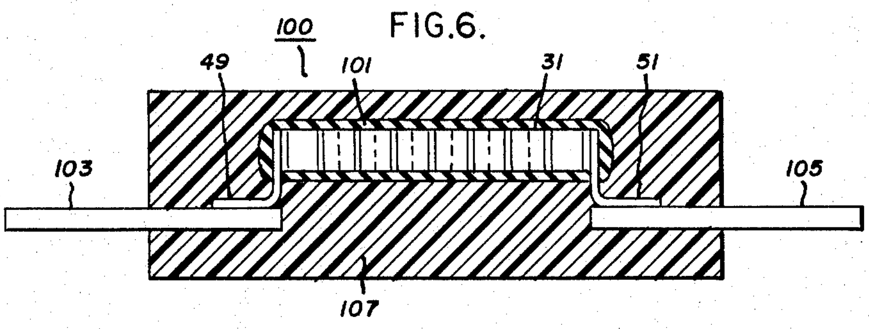
FIG. 6 is an elevation, partly in section, of a semiconductor device constructed according to my invention.

A rectifier 100 formed according to my invention is shown in FIG. 6. Surrounding the unitary dice stack 31 forming the electrically active portion of the rectifier a conventional passivant layer 101 is schematically illustrated. This may be one or a combination of conventional junction passivation layers of any type well known in the art. I have found it particularly advantageous to protect the unitary dice stack from contaminants by initially dip coating the surface of the stack with a room temperature vulcanizing silicone rubber of a type commonly employed for junction passivation. Over this is applied a layer of silicone varnish by dip coating. It is contemplated that other junction passivants, such as glass, alone or in combination with resin and/or varnish passivant materials may be utilized.

Where the cross sectional area of the dice stack is quite small, as in the formation of rectifiers having low current conducting capabilities, the electrical conductors 49 and 51 may be too small and fragile for direct use as terminal leads for a completed rectifier. Accordingly it may be desirable to attach these electrical conductors to heavier gauge terminal leads. In FIG. 6 the conductor 49 is shown bonded to terminal lead 103 while conductor 51 is bonded to terminal lead 105. Preferably a conventional low temperature solder is used for bonding which has a working temperature below the melting point of the conductor to semiconductor bond and below the melting point of the metal internally bonding the unitary dice stack. After attachment of the terminal leads a conventional housing may be formed about the passivated stack in any conventional manner. As shown, a plastic housing 107 formed of a material, such as epoxy, phenolic, or silicone resin, is molded around the passivated stack, conductors, and the inner extremities of the terminal leads to complete protective encapsulation of the rectifier according to process Step K, FIG. 1.

While I have described my invention with reference to preferred embodiments, it is appreciated that one or more of the advantages of my invention are realizable utilizing variant processes and rectifier structures. For example, it is not necessary that the stack originally formed be subdivided to form smaller cross-sectional area rectifier elements. It is appreciated that the wafers initially used be initially sized to conform to the desired cross-section of a completed rectifier stack. Thus, although I recognize specific advantages for the wafer subdivision process utilized, this is not considered an essential to all applications of my invention.

While I have referred specifically to the bonding of P conductivity type attachment wafers, it is recognized that N conductivity type wafers may also be employed as attachment wafers. Where a stack of junction containing wafers presents end surfaces of opposite conductivity type, it is recognized that the bonding of only one attachment wafer is required and that this attachment wafer will be bonded to the end surface of the junction wafer stack which is of opposite conductivity to it, so that both ends of the resultant stack will be of like conductivity type. For specific applications it may be desirable that the attachment wafers themselves contain junctions, although generally the attachment wafers may be junctionless. Instead of plating the internal bonding metallization it is recognized that metallization for internal bonding may be supplied by positioning preforms between the stacked wafers, although somewhat greater care will be required to assure a tenacious bond to all surfaces.

It is recognized that the number and sequence of steps disclosed may be varied appreciably without departing from my invention. While I have disclosed the formation of a wafer stack including attachment wafers in a single bonding operation, it is appreciated that a wafer stack may be built up through a plurality of sequential bonding operations. The preparation of the stack faces for lead attachment may be delayed until after removal of the excess metal from the edge of the stack or until just prior to lead attachment. At the risk of obtaining a somewhat inferior lead attachment the step of surface preparation for lead attachment may be wholly or partially omitted. Etching to assure cleanliness of the stack elements during processing may be undertaken as desired during processing. It is immaterial how many or few etchings are performed so long as the unitary diced stacks are thoroughly cleaned prior to passivation.

Instead of attaching leads, passivating, and encapsulating the unitary dice stacks in the manner described it is appreciated that other conventional techniques may be substituted. For example, it is not necessary to use a lead attachment fixture or technique as described in connection with FIG. 5, although this is preferred. Additionally passivation techniques other than those disclosed above may be utilized, such as surface oxidation of silicon or nitride over oxide, for example. Instead of utilizing a molded casement as disclosed, rectifiers may be formed according to my invention relying upon hermetic case encapsulation. In such instance surface passivation may be entirely omitted.

While I have described my invention with reference to stacking and bonding a plurality of $PNN^+$ wafers, it is appreciated that my invention is applicable to wafers of any junction arrangement that provide surfaces of unlike conductivity characteristics for bonding. For example, instead of $PNN^+$ wafers my inventive process could as well be applied to the stacking and bonding of $P^+PN$, PIN, or PNPN rectifier wafers. Additionally, it is not necessary that a plurality of junction containing wafers be stacked in order to realize benefits.

Figure 7:
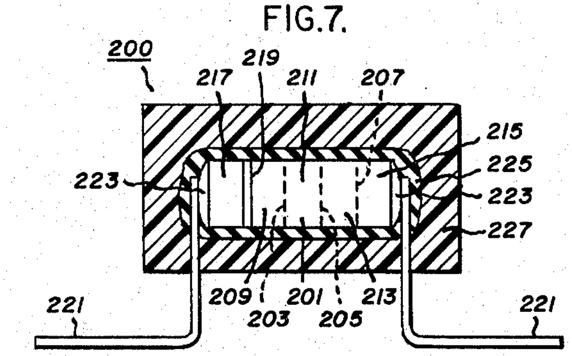
FIG. 7 is an elevation, partly in section, of an alternate semiconductor device constructed according to my invention.

This may be better appreciated by reference to the rectifier 200 formed according to my invention illustrated in FIG. 7. A semiconductive element 201 is provided with junctions 203, 205, and 207 separating zones 209, 211, 213, and 215. Zones 209 and 213 are of a first conductivity type, which may be either N or P conductivity type, while zones 211 and 215 are of opposite conductivity type. A semiconductive element 217 of low resistivity and of a conductivity type corresponding to that of zone 215 is attached to the zone 209 by bonding material 219. A terminal lead 221 is attached to the semiconductive element 217 by bonding means 223. An identical terminal lead 221 is attached to the endmost surface of the zone 215 by the same bonding means 223. A passivant layer 225 encloses the semiconductive elements. A plastic housing 227 protectively encapsulates the passivant layer and forms a protective casement for the rectifier. The materials choices for the elements of the rectifier 200 are identical to those previously discussed with reference to the rectifier 100.

Other variant forms of my invention are, of course, possible and will readily occur to those skilled in the art.

What I claim and desire to secure by Letters Patent of the United States is:

1. In a semiconductor device the improvement comprising junction containing semiconductive means presenting first and second spaced bonding surfaces of first and second conductivity types, respectively, in which said junction containing semiconductive means includes at least one semiconductive crystal having four successively arranged zones of alternating P and N conductivity type characteristics forming three junctions therebetween, electrical conductors for low impedance electrical interconnection to said spaced bonding surfaces, low resistivity attachment semiconductive means presenting interconnection surfaces and being of said first conductivity type throughout interposed between said second bonding surface and one of said electrical conductors, first means for bonding said attachment semiconductive means to said second bonding surface, and second bonding means for forming a low impedance electrical connection between one of said conductors and said first bonding surface and between a remaining of said conductors and said attachment semiconductive means, said second bonding means being preferentially adherent to semiconductive surfaces of said first conductivity type.

2. In a semiconductor device the improvement comprising a semiconductive stack comprised of a plurality of junction containing silicon semiconductive crystals, two like conductivity type low resistivity silicon crystals of like conductivity type throughout forming the endmost crystals of said stack, and a layer of metal chosen from the class consisting of aluminum and gold, interposed between each adjacent pair of crystals bonding said stack into a unitary body, two identical electrical conductors, and bonding means forming identical interconnections to each of said endmost crystals of said stack and to said electrical conductors.

3. The combination comprising a plurality of semiconductive elements each including first and second opposed major surfaces, a zone of P conductivity type adjacent said first major surface, and a zone of N conductivity type adjacent said second major surface, said N and P conductivity type zones in each of said elements forming a junction therebetween, said junction containing semiconductive elements being stacked in series with adjacent major surfaces of adjacent semiconductive elements being of opposite conductivity type, first and second endmost junctionless attachment semiconductive elements of low resistivity and like conductivity type each being located adjacent an endmost of said stacked junction containing semiconductive elements, first low impedance bonding means being interposed between and uniting adjacent of said semiconductive elements, first and second electrical conductors, and second low impedance bonding means for uniting said attachment semiconductive elements to said electrical conductors, said second bonding means having a melting point at most equal to that of said first bonding means and being preferentially adherent to semiconductive surfaces of a conductivity type corresponding to that of said attachment semiconductive elements.

4. The combination according to claim 3 in which said attachment semiconductive elements are of P conductivity type, said first bonding means is aluminum, and said second bonding means is gold.

5. The combination according to claim 3 in which said attachment semiconductive elements contain at least $10^{20}$ impurity atoms per cubic centimeter.

* * * * *